(12) United States Patent
Mehrad et al.

(10) Patent No.: US 6,930,018 B2
(45) Date of Patent: Aug. 16, 2005

(54) SHALLOW TRENCH ISOLATION STRUCTURE AND METHOD

(75) Inventors: Freidoon Mehrad, Plano, TX (US); Zhihao Chen, Plano, TX (US); Shashank S. Ekbote, Richardson, TX (US); Brian Trentman, Sherman, TX (US)

(73) Assignee: Texas Instruments Incorporated, Dallas, TX (US)

( * ) Notice: Subject to any disclaimer, the term of this patent is extended or adjusted under 35 U.S.C. 154(b) by 148 days.

(21) Appl. No.: 10/196,089

(22) Filed: Jul. 16, 2002

(65) Prior Publication Data

US 2004/0014291 A1 Jan. 22, 2004

(51) Int. Cl.⁷ .......................................... H01L 21/8222
(52) U.S. Cl. ...................... 438/430; 438/437; 438/439; 438/431
(58) Field of Search ................. 438/431, 430, 438/425, 437

(56) References Cited

U.S. PATENT DOCUMENTS

| | | | | | |
|---|---|---|---|---|---|
| 5,872,045 A | * | 2/1999 | Lou et al. | ................... | 438/432 |
| 5,989,978 A | * | 11/1999 | Peidous | ....................... | 438/436 |
| 6,358,796 B1 | * | 3/2002 | Lin et al. | .................... | 438/257 |

* cited by examiner

*Primary Examiner*—Thao P. Le
(74) *Attorney, Agent, or Firm*—Yingsheng Tung; Wade James Brady, III; Frederick J. Telecky, Jr.

(57) ABSTRACT

Disclosed is a shallow trench isolation (STI) structure and methods of manufacturing the same. The methods eliminate the requirement for design size adjustments (DSA) in manufacturing the STI structure. Further disclosed is an STI trench liner and methods for the formation thereof by growing a thin oxide layer on shallow isolation trench surfaces while preventing oxide formation on adjacent nitride surfaces, followed by the deposition of, and oxide growth upon, a polysilicon layer.

16 Claims, 3 Drawing Sheets

SHALLOW TRENCH ISOLATION STRUCTURE AND METHOD

TECHNICAL FIELD

The present invention relates in general to semiconductor device fabrication and more particularly to methods of forming shallow trench isolation (STI) structures and to polysilicon liner formation in shallow trench isolation (STI) structures.

BACKGROUND OF THE INVENTION

In the fabrication of semiconductor devices, isolation structures are often formed between active areas in which electrical devices such as transistors, memory cells, or the like, are to be formed. The isolation structures are typically formed during initial processing of a semiconductor substrate, prior to the formation of such electrical devices. Typical isolation techniques include shallow trench isolation (STI).

Shallow trench isolation (STI) techniques involve the formation of shallow trenches in the isolation areas or regions of a semiconductor wafer. The shallow trenches are then filled with dielectric material such as silicon dioxide to provide electrical isolation between devices subsequently formed in the active regions on either side of the filled trenches.

In forming an STI structure, a pad oxide layer and nitride layer are typically formed over the substrate surface and patterned to expose only the isolation regions. The nitride layer operates as a hard mask during subsequent processing steps, and the pad oxide layer functions to relieve stress between the underlying silicon substrate and nitride layer. An isotropic etch is then performed to form a trench through the nitride, pad oxide, and substrate. Once the trench is etched, oxide material is typically deposited to fill the trench. Thereafter, the device is commonly planarized using a chemical mechanical polishing (CMP) process and the nitride layer is removed using hot phosphoric acid deglazing.

In conventional shallow trench isolation processing, the formation of unwanted oxide recesses or "divots" at the sharp corners at the isolation trench moat can cause various problems with the later fabrication processing of transistors and other devices in the adjacent active regions. Such divots can form due to the erosion of oxide during deglazing. Another problem with conventional processes is the necessity of using a design size adjust (DSA) in an effort to adjust the process in order to fabricate a device of the desired size. For example, due to predicted silicon loss after oxide liner growth, it is known to make the trench smaller than the desired final dimensions. Thus, if the predictions are correct, the correct size is achieved. In addition to uncertainty in making predictive design size adjustments, problems arise in attempting to make the trenches smaller to allow for the loss of material during later processing. Due to their size, smaller trenches are more difficult to pattern, etch, and fill properly. One such problem with fill, particularly in smaller dimension devices, is "bottlenecking" due to the nature of the walls of the isolation trench. The trench walls, being etched from silicon crystal, have a changing planar orientation throughout their slope. This causes increased oxide growth near the top of the walls, and decreased oxide growth near the bottom. The resulting thicker oxide layer at the top impedes filling.

FIG. 1 is a cross-section view of an example of an STI structure known in the arts. A representative portion of a device 10 is shown with an STI structure 12. A trench 14 has been etched into a silicon substrate 16 and a pad oxide layer 18 has been grown using a thermal oxidation process. A nitride layer (not shown) is commonly used to protect the remainder of the device during the formation of trenches. The trench 14 has its walls 20 covered with an oxide liner 19. It can be seen that the oxide liner 19 exhibits bottle-necking 22 at the upper portion of the walls 20. The trench 14 is filled with dielectric oxide material 24 and the protective nitride layer has been removed from the remainder of the device 10, leaving divots 26 at the edges of the dielectric material 24 of the STI structure 12. Divots 26 are caused by deglazing the moat nitride and by subsequent processing using hydrofluoric acid deglaze. Attempts have been made to address the problems of divot and bottleneck formation, such as moat nitride pullback and in-situ steam generation processing (ISSG), however such efforts have been troublesome due to the susceptibility of the structure to damage during further processing.

Improved STI techniques would be desirable in the art. Shallow trench isolation processes that prevent deterioration of STI structures during further processing and reduce or eliminate the need for DSA would be useful and advantageous. Further advantages would inhere in such improved processes suitable for use with current manufacturing equipment and processes, yet adaptable to avoiding the formation of divots and bottlenecking.

SUMMARY OF THE INVENTION

In carrying out the principles of the present invention, in accordance with an embodiment thereof, methods of manufacturing a shallow trench isolation structure are described. The methods include the step of growing an oxide layer on the walls of a shallow isolation trench followed by steps of depositing a polysilicon layer on the oxide layer, and oxidizing the polysilicon layer.

According to another aspect of the invention, an oxide layer of approximately 10 to 50 angstroms in thickness is grown on the walls of a shallow isolation trench at a temperature below that which would grow oxide on nitride surfaces. A polysilicon layer of approximately 25 to 100 angstroms in thickness is deposited on the oxide layer and is subsequently oxidized.

According to another aspect of the invention, a preferred embodiment is disclosed in which a shallow trench isolation structure liner includes an oxide layer affixed to the trench walls, a polysilicon layer affixed to the oxide layer, and a polysilicon oxide layer formed thereupon.

These and other features, advantages, and benefits of the present invention will become apparent to one of ordinary skill in the art upon careful consideration of the detailed description of a representative embodiment of the invention in connection with the accompanying drawings.

BRIEF DESCRIPTION OF THE DRAWINGS

The present invention will be more clearly understood from consideration of the following detailed description and drawings in which.

References in the detailed description correspond to like references in the figures unless otherwise noted. Like numerals refer to like parts throughout the various figures. Descriptive and directional terms used in the written description such as top, bottom, left, right, etc., refer to the drawings themselves as laid out on the paper and not to physical limitations of the invention unless specifically noted. The drawings are not to scale and some features of embodiments shown and discussed are simplified or exaggerated for illustrating the principles, features, and advantages of the invention.

DETAILED DESCRIPTION OF PREFERRED EMBODIMENTS

Understanding of the invention will be enhanced with reference to FIGS. 2A through 2G representatively illustrating steps in the production of an STI structure and liner in accordance with the invention. It should be appreciated that some of the steps may be performed using known processes and material, but without the necessity of a design size adjust (DSA) as further described.

Figure 1:
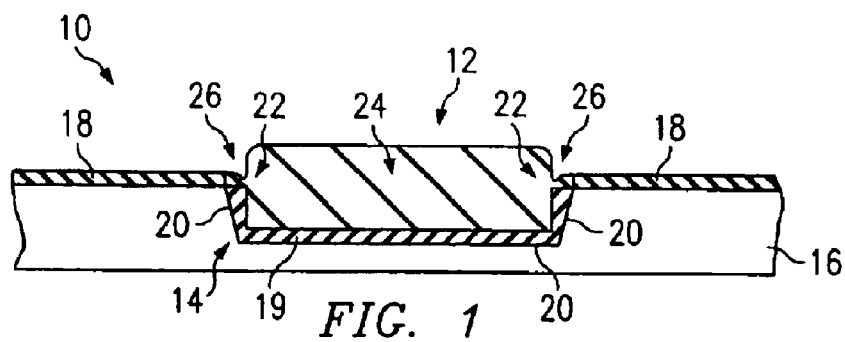
FIG. 1 is a cross-section view of an example of an STI structure known in the arts exhibiting divots and bottleneck-ing.
Figure 2A:
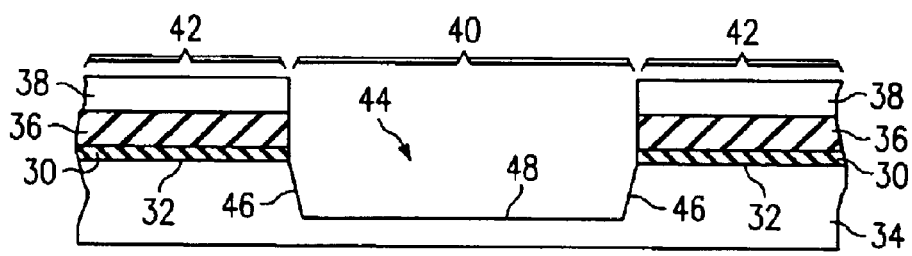
FIGS. 2A through 2G are a series of cross-section views showing an example of the steps of a preferred method of the invention.

Now referring primarily to FIG. 2A, a pad oxide 30 is grown on the face 32 of a silicon wafer 34 using processes known in the arts such as thermal oxidation growth or deposition. A nitride layer 36 is deposited atop the pad oxide layer 30. The nitride layer 36 acts as a mask in subsequent processing to protect the underlying regions of the substrate 16 and is later removed. The nitride layer 36 may be formed using deposition techniques and materials known in the arts. Typically, a resist layer is formed over the nitride layer 36, and patterned to form a mask 38 exposing isolation regions 40 of the substrate and covering other regions 42. The patterning may be performed according to techniques known in the arts, however, no DSA is required.

Using the mask 38, the nitride 36, oxide 30, and silicon 34 are etched to form a shallow trench 44. The shallow trench 44 may be etched using known trench etching techniques, such as reactive ion etching (RIE), suitable for forming a trench 44 having sidewalls 46 terminating at a bottom 48. Resist cleanup is performed and hydrofluoric acid (HF) deglaze cleans the exposed silicon 34 surface for subsequent processing. Of course it will be understood by those familiar with the arts that equivalent means may be substituted for certain steps used to produce the trench 44 depicted in the example of FIG. 2A without departure from the concept of the invention.

Figure 2B:
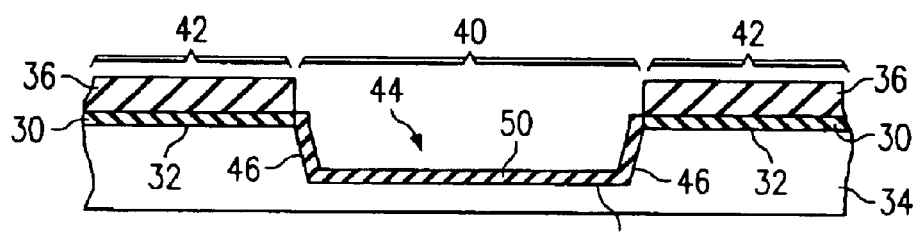

FIG. 2B illustrates further steps in the process of the manufacture of an STI structure according to the invention. The mask 38 (of FIG. 2A) has been removed as known in the arts. A thin oxide layer 50 is thermally grown on the side walls 46 and bottom 48 of the trench 44. The oxide layer 50 is preferably grown to a thickness of about 30 Å, although a thickness from approximately 10 Å to 50 Å may be used. The oxide layer 50 is provided in order to present a good bonding surface at the trench 44 sidewalls 46 and bottom 48. It should be understood that the thin oxide layer 50 is not grown on the exposed nitride layer 36. This is accomplished by maintaining a temperature from approximately 750° C. to 850° C. during the oxide 50 growing step. Preferably a temperature of approximately 800° C. is used in order to promote adequate and timely oxide 50 growth in the trench 44 while preventing growth on the nitride 36.

Figure 2C:
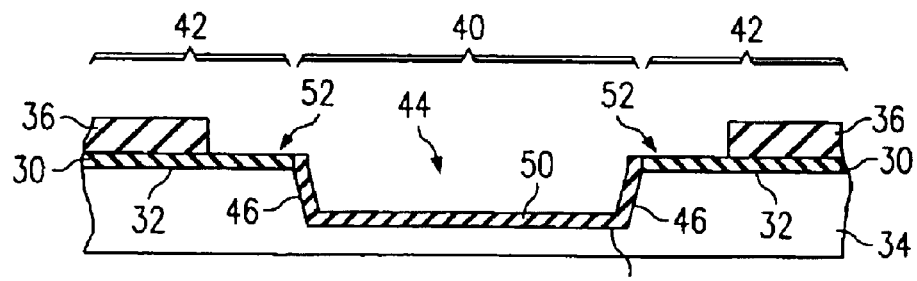

FIG. 2C assists in illustrating an alternative embodiment of the invention including a step of performing moat nitride 36 pullback as known in the arts. The nitride 36 layer is removed in the regions 52 adjacent to the trench 44. This is a preferred step for preventing the formation of divots during subsequent processing. The thin oxide layer 50 is grown in the manner described, preferably at a temperature of approximately 800° C., thus promoting thin oxide 50 growth on the trench 44 walls 46 and bottom 48, and preventing oxide formation on the nitride 36 surface. Following this, the nitride layer 36 is "pulled back" 52, typically using hot phosphoric acid as known in the arts.

Figure 2D:
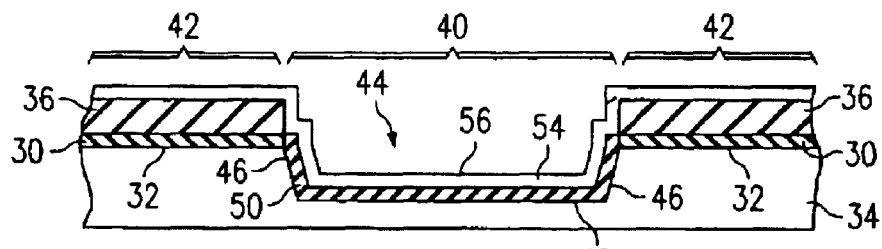

Shown in FIG. 2D, a polysilicon layer 54 is deposited on the thin oxide layer 50. Preferably, the polysilicon layer 54 is approximately 50 Å in thickness. Although other thicknesses may be used, it is preferable to use a relatively thin layer from approximately 25 Å to approximately 100 Å to ensure adequate but not excessive coverage. The polysilicon layer 54 is then oxidized, completing the formation of a liner 56 covering the trench 44 walls 46 and bottom 48.

Figure 2E:
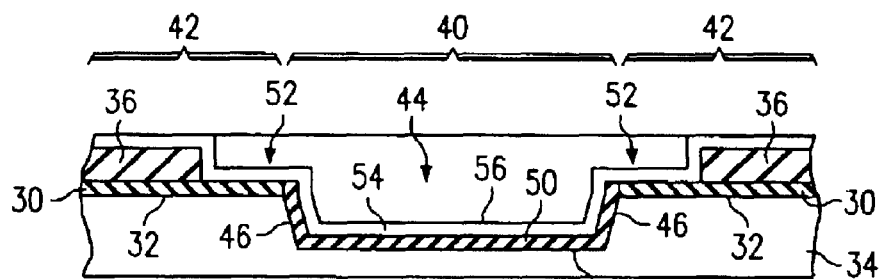

Similarly, in the embodiment of the invention illustrated in FIG. 2E, a polysilicon layer 54 is deposited atop the thin oxide layer 50, preferably from approximately 25 Å to approximately 100 Å in thickness, more preferably about 50 Å thick. The polysilicon layer 54 is oxidized, forming a liner 56 covering the trench 44 surfaces 46, 48. It should be understood that ISSG may be advantageously used in the formation of the thin oxide liner 50 described with reference to FIGS. 2D and 2E. ISSG oxidation results in uniform and conformal growth of oxide 54 through the whole trench 44, which may not be achievable using wet or dry oxidation alone.

Figure 2F:
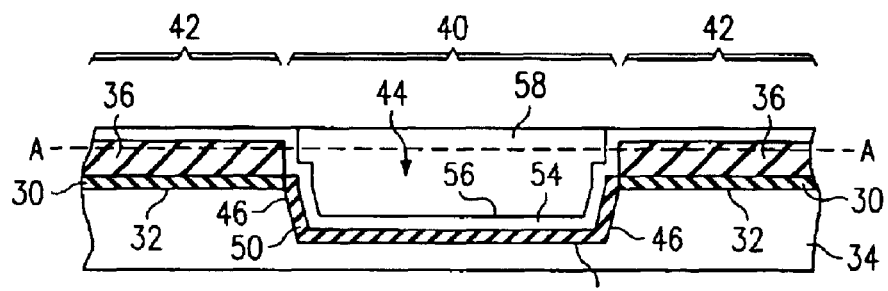
Figure 2G:
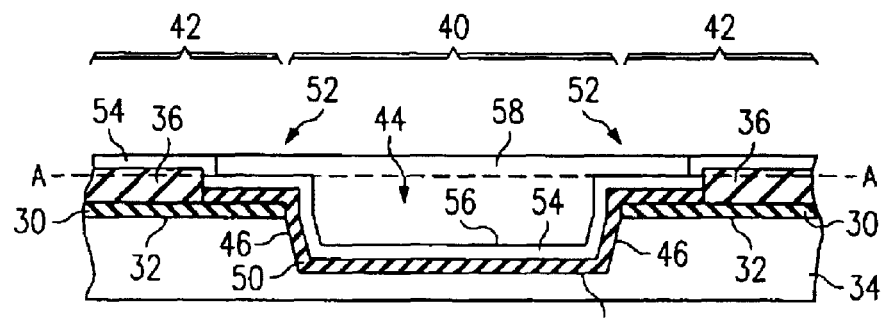

Further processing is represented in FIGS. 2F and 2G, showing the addition of dielectric fill material 58 prior to completion of the STI structure. Chemical mechanical polishing (CMP) may then be performed removing material as indicated by line A—A of FIGS. 2F and 2G, as known in the arts.

Figure 3:
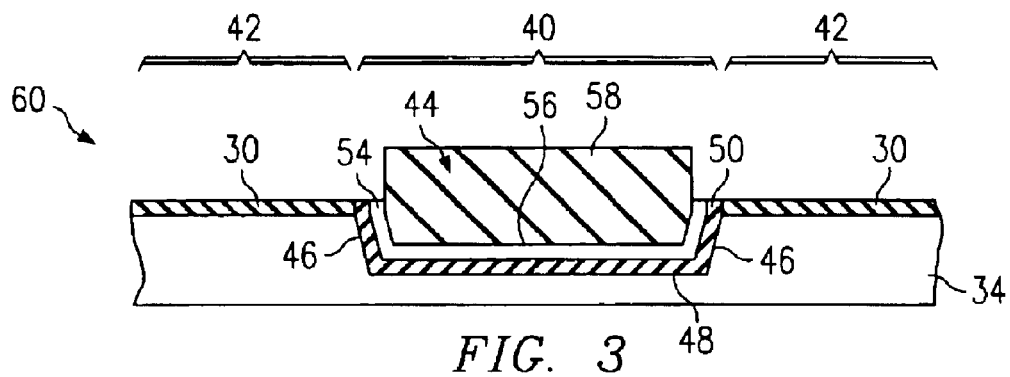
FIG. 3 is a cross-section view of an example of an STI structure liner according to a preferred embodiment of the invention.

Representatively illustrated in FIG. 3, a cross-section view shows an alternative depiction a preferred embodiment of a shallow trench isolation structure 60 according to the invention. The trench 44 is filled with dielectric fill material 58. Divots and bottlenecking are substantially reduced or eliminated. The liner 56 has a thin oxide layer 50 to promote bonding. Atop the thin oxide layer 50, an oxidized polysilicon layer 54 completes the liner 56. Preferably, the liner 56 is from about 35 to 150 angstroms in total thickness, providing a readily fillable trench 44 with a good bonding surface, while providing protection of the underlying silicon 34 during processing. The STI structure 60 is preserved during further processing steps targeted to selected areas of the wafer.

Figure 4:
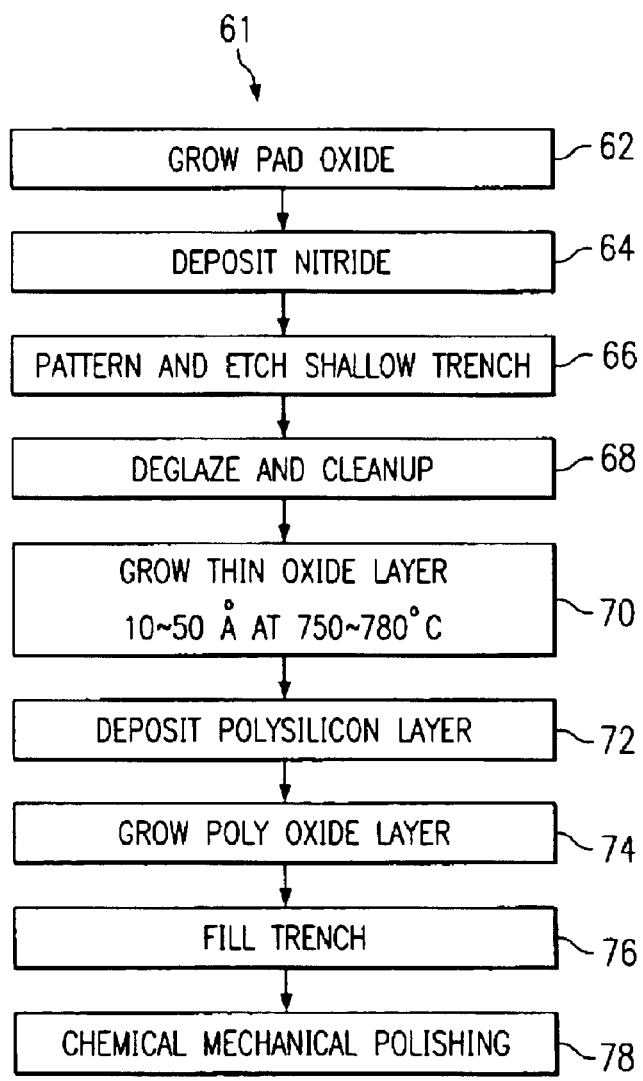
FIG. 4 is a process flow diagram showing steps in a preferred method of the invention.

FIG. 4 is an illustration of the process flow 61 showing steps in a preferred method of the invention. Pad oxide is grown on a semiconductor wafer, step 62. A nitride layer is then deposited, at step 64, to provide a protective mask. It should be understood that DSA is not required. At step 66, the wafer is patterned and etched to form a shallow trench. After the clean up and deglaze, step 68, a thin oxide layer is grown, step 70. The thin oxide layer is grown within the trench but not on the nitride surfaces. Preferably, the thin oxide layer is grown at a temperature between about 750 and 850 degrees centigrade to a thickness of about 10 to 50 angstroms. At step 72, a polysilicon layer is deposited upon the thin oxide layer. Preferably the polysilicon layer is deposited to a thickness of about 25 to 100 angstroms. The polysilicon layer is oxidized as shown in step 74. The trench is then filled, step 76, and the resulting structure is subjected to chemical mechanical polishing at step 78. The STI isolation structure is preserved during further device processing as known in the arts.

Thus, the invention provides improved shallow trench isolation structures, trench liners, and related methods which may be used in combination with moat nitride pullback, ISSG oxidation, and other device processing steps. Various advantages are provided including but not limited to the improved STI structure after processing and the elimination of the necessity for design size adjustments during processing. While the invention has been described with reference to illustrative embodiments, this description is not intended to be construed in a limiting sense. Various modifications and combinations of the illustrative embodiments as well as other advantages and embodiments of the invention will be apparent to persons skilled in the art upon reference to the description and claims.

We claim:

1. A method of manufacturing a shallow trench isolation structure comprising the steps of:

providing a semiconductor wafer having a top surface;

forming a shallow isolation trench near the top surface having sidewall areas and a bottom area;

depositing a polysilicon layer from approximately 25 Å to approximately 100 Å in thickness on the top surface, conforming to the contour of the top surface including the shallow trench sidewall surface and bottom; and converting the polysilicon layer into a silicon dioxide layer conforming to the contour of the top surface, including the shallow-trench sidewalls and shallow-trench bottom.

2. The method of manufacturing a shallow trench isolation structure according to claim 1, further including the step of growing a layer of an oxide layer under and adjacent the deposited polysilicon layer at a temperature of less than approximately 900° C.

3. The method of manufacturing a shallow trench isolation structure according to claim 1, further including the step of growing a layer of an oxide layer under and adjacent the deposited polysilicon layer at a temperature of greater than approximately 700° C.

4. The method of manufacturing a shallow trench isolation structure according to claim 1, further including the step of growing a layer of an oxide layer under and adjacent the deposited polysilicon layer at a temperature within the range of approximately 750° C. to approximately 850° C.

5. The method of manufacturing a shallow trench isolation structure according to claim 1, further including the step of growing a layer of an oxide layer under and adjacent the deposited polysilicon layer at a temperature of approximately 800° C.

6. The method of manufacturing a shallow trench isolation structure according to claim 1, further including the step of growing a layer of an oxide layer under and adjacent the deposited polysilicon layer less than approximately 50 Å in thickness.

7. The method of manufacturing a shallow trench isolation structure according to claim 1, further including the step of growing a layer of an oxide layer under and adjacent the deposited polysilicon layer from approximately 10 Å to approximately 50 Å in thickness.

8. The method of manufacturing a shallow trench isolation structure according to claim 1 wherein the polysilicon layer is deposited to less than approximately 100 Å in thickness.

9. The method of manufacturing a shallow trench isolation structure according to claim 1 wherein the polysilicon layer is deposited from approximately 25 Å to approximately 100 Å in thickness.

10. The method of manufacturing a shallow trench isolation structure according to claim 1 further comprising the step of performing moat nitride pullback.

11. The method of manufacturing a shallow trench isolation structure according to claim 1 further comprising the step of oxidization by in-situ steam generation—ISSG.

12. A method of manufacturing a shallow trench isolation structure comprising the steps of:

providing a semiconductor wafer having a top surface;

forming a shallow trench near the top surface having sidewalls and a bottom region;

growing an oxide layer from approximately 10 Å to approximately 50 Å in thickness on the sidewalls and the bottom region of a shallow isolation trench at a temperature within the range of approximately 750° C. to approximately 850° C.;

depositing a polysilicon layer from approximately 25 Å to approximately 100 Å in thickness on the oxide layer, conforming to the contour of the top surface including the sidewall surfaces and the bottom surface; and converting the polysilicon layer into a silicon dioxide layer conforming to the contour of the top surface, including the shallow-trench sidewalls and shallow-trench bottom.

13. The method of manufacturing a shallow trench isolation structure according to claim 12 wherein the oxide layer is grown at a temperature of approximately 800° C.

14. The method of manufacturing a shallow trench isolation structure according to claim 12 wherein the polysilicon layer is deposited to approximately 50 Å in thickness.

15. The method of manufacturing a shallow trench isolation structure according to claim 12 further comprising the step of performing moat nitride pullback.

16. The method of manufacturing a shallow trench isolation structure according to claim 12 further comprising the step of performing ISSG.

* * * * *